US006437982B1

(12) United States Patent
Cardenas

(10) Patent No.: US 6,437,982 B1
(45) Date of Patent: Aug. 20, 2002

(54) EXTERNAL ATTACHED HEAT SINK FOLD OUT

(75) Inventor: Marlon Cardenas, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/746,089

(22) Filed: Feb. 20, 2001

(51) Int. Cl.[7] .............................................. H05K 7/20

(52) U.S. Cl. ............ 361/700; 29/890.032; 165/104.33; 361/687

(58) Field of Search ................................ 361/695, 697, 361/686, 687, 703, 704, 699, 700, 719; 165/80.3, 80.4, 104.33; 454/184; 29/890.032; 62/259.2

(56) References Cited

U.S. PATENT DOCUMENTS

| | | | | | |
|---|---|---|---|---|---|
| 5,808,869 | A | * | 9/1998 | Donahoe et al. | 361/704 |
| 6,118,654 | A | * | 9/2000 | Bhatia | 361/687 |
| 6,276,448 | B1 | * | 8/2001 | Maruno | 165/185 |
| 6,308,524 | B1 | * | 10/2001 | Mochizuki | |

* cited by examiner

*Primary Examiner*—Gerald Tolin
(74) *Attorney, Agent, or Firm*—Blakely, Sokoloff, Taylor & Zafman LLP

(57) ABSTRACT

A heat sink insertable into a computer and attached to the computer. The heat sink is coupled to a heat pipe. When the heat sink is inserted into the computer, the heat pipe is disengaged from a heat source. When the heat sink is removed from the computer, the heat pipe is engaged with the heat source to transfer heat generated by the heat source to the heat sink, which is external to the computer.

15 Claims, 4 Drawing Sheets

EXTERNAL ATTACHED HEAT SINK FOLD OUT

BACKGROUND OF THE INVENTION

As technology gets to the limits of cooling notebooks, there is a need for improved techniques for cooling the notebooks if we are to keep the form factor unchanged. For example, processors are getting faster yet notebook users want to have thinner notebooks. As a result, a problem is presented if notebooks remain cooler and hot spots (exceeded temperature limits on the external surface of the notebook) are kept from developing. There is limited space to work with in notebooks, especially with notebooks becoming thinner.

Typically, with a full feature notebook, the base is a little thicker than the average notebook and a large fan can keep the notebook cool. But in thinner systems, smaller fans are used that are not as powerful. Although the voltage can be increased to make the small fans more powerful, acoustical limits of user acceptance need to be taken into account. If a small fan is made too powerful, noise created by the fan may become unacceptable to notebook users.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and apparatus for providing an external heat sink fold out that is attached to a computer system, is disclosed. In the following description, for purposes of explanation, specific details are set forth to provide a thorough understanding of the present invention. However, it will be apparent to one skilled in the art that these specific details are not required in order to practice the present invention.

Figure 1A:
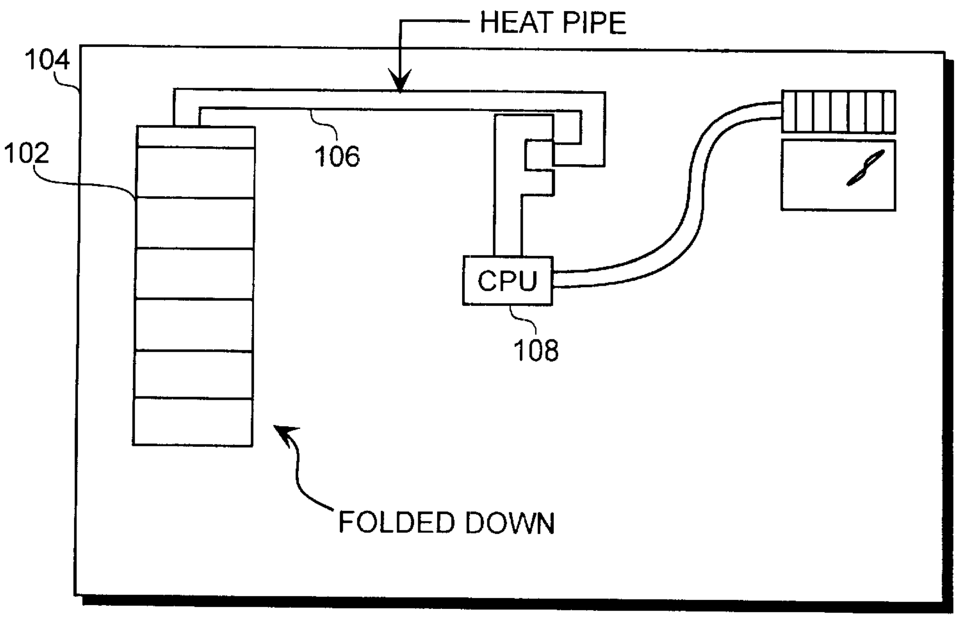
FIG. 1*a* illustrates a top view of a computer having the attached heat sink inserted in the computer system according to one embodiment.

As illustrated in FIG. 1*a*, in one embodiment, a heat sink 102 is insertable into a bay of a computer 104. The heat sink 102 is coupled to a heat pipe 106. In one embodiment, the heat pipe 106 includes a wick to transfer heat from a heat source 108 (e.g., a processor) in contact with the heat pipe 106 at one end to the heat sink 102 in contact with the heat pipe 106 at an opposite end. In alternative embodiments, other types of heat pipes could be used (e.g., a loop heat pipe as described in more detail below), without departing from the scope of the invention.

Figure 1B:
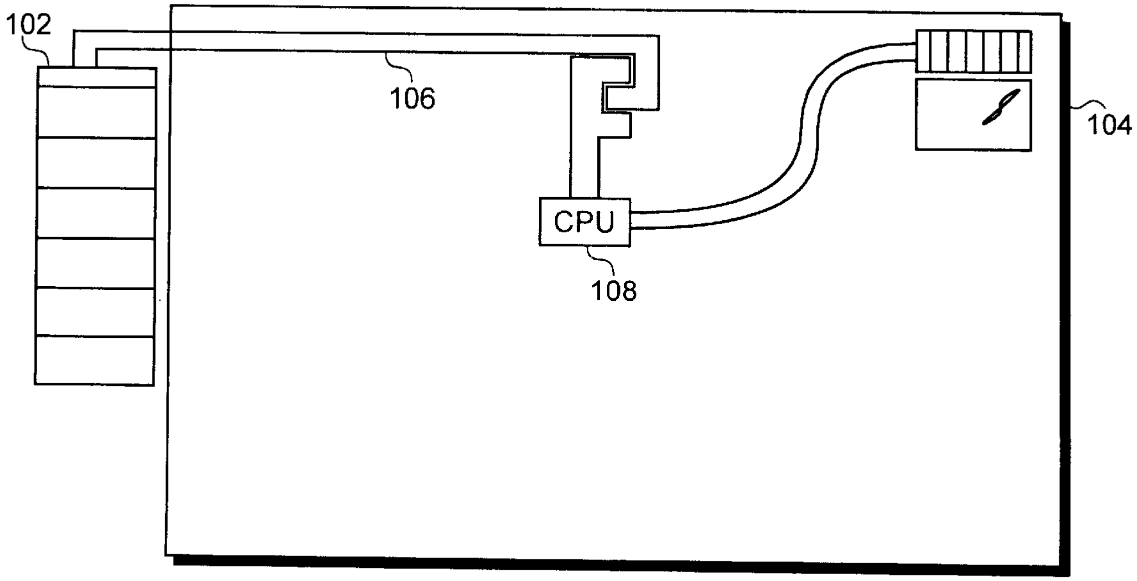
FIG. 1*b* illustrates a top view of a computer having the attached heat sink removed from the computer system according to one embodiment.

As shown in FIG. 1*a*, when the heat sink 102 is inserted into the bay of the computer 104, the heat pipe 106 is disengaged from the heat source 108 (i.e., deactivated). As shown in FIG. 1*b*, when the heat sink 102 is removed from the computer notebook 104, the heat pipe 106 is engaged with the heat source 108 to transfer heat generated by the heat source 108 to the heat sink 102 (i.e., activated), which is external to the computer 104.

Figure 2A:
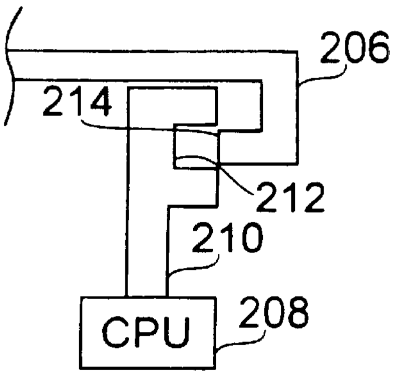
FIGS. 2*a–b* illustrate the heat pipe engaging the heat source when the attached heat sink is inserted into the computer system and removed from the computer system, according to one embodiment.
Figure 2B:
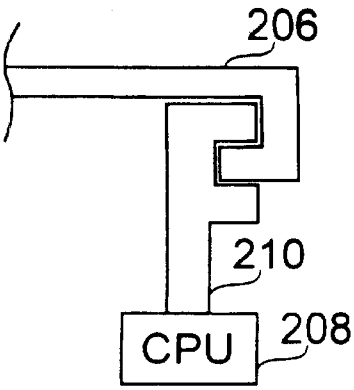

Shown in greater detail in FIGS. 2*a–b*, a first mating device 210 coupled to the heat source 208, may have a receiving end 212 to receive an end 214 of the heat pipe 206 when the heat sink is external to the computer system. FIG. 2*a* illustrates when the heat sink is inserted in to the computer system and the heat pipe is not in contact with the heat source. FIG. 2*b* illustrates when the heat sink is external to the computer system and the heat pipe is accordingly in contact with the receiving end of the mating device attached to the heating source. In alternative embodiments, alternative configurations may used to interconnect the heat pipe 206 and the heat source. Moreover, a grease, phase change material or other type of thermal interface material may be used to assist in the merging of the end 214 of the heat pipe 206 and the receiving end 212 of the first mating device 210.

Figure 3A:
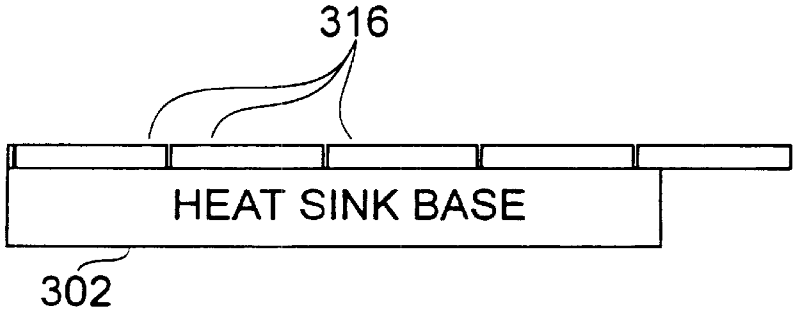
FIG. 3*a* illustrates fins coupled to the heat sink in a folded state when the heat sink is inserted in the computer system.
Figure 3B:
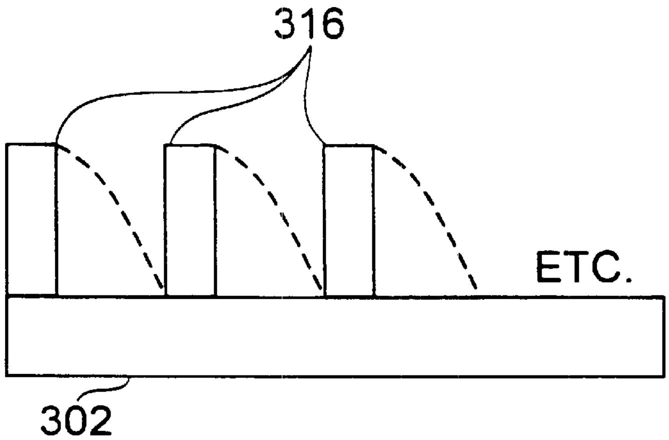
FIG. 3*b* illustrates fins coupled to the heat sink in an unfolded state when the attached heat sink is removed from the computer system.

In one embodiment, as illustrated in FIGS. 3*a–b*, the heat sink 302 includes a set of fins 316. When the heat sink 302 is inserted into the computer notebook, the fins 316 are folded (as illustrated in FIG. 3*a*, to allow the heat sink to consume less space when inserted in the computer. When the heat sink 302 is removed from the notebook, the fins 316 of the heat sink unfold (as illustrated in FIG. 3*b*) to assist in dissipating the heat generated by the heat source. The size of the fins can vary based upon implementation design, with larger fins presumably providing greater heat dissipation.

Figure 4A:
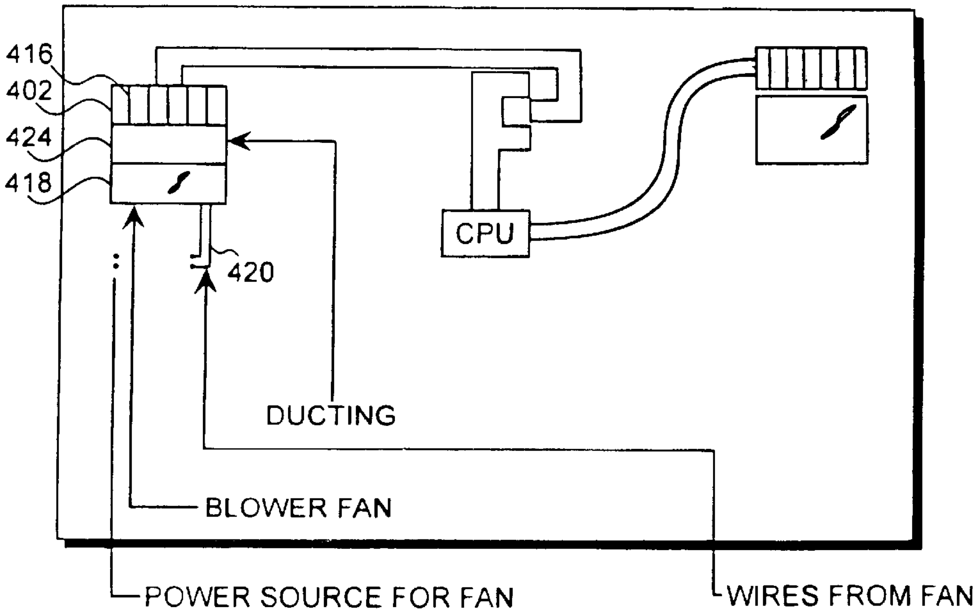
FIGS. 4*a–b* illustrate an active cooling mechanism attached to the heat sink according to one embodiment.
Figure 4B:
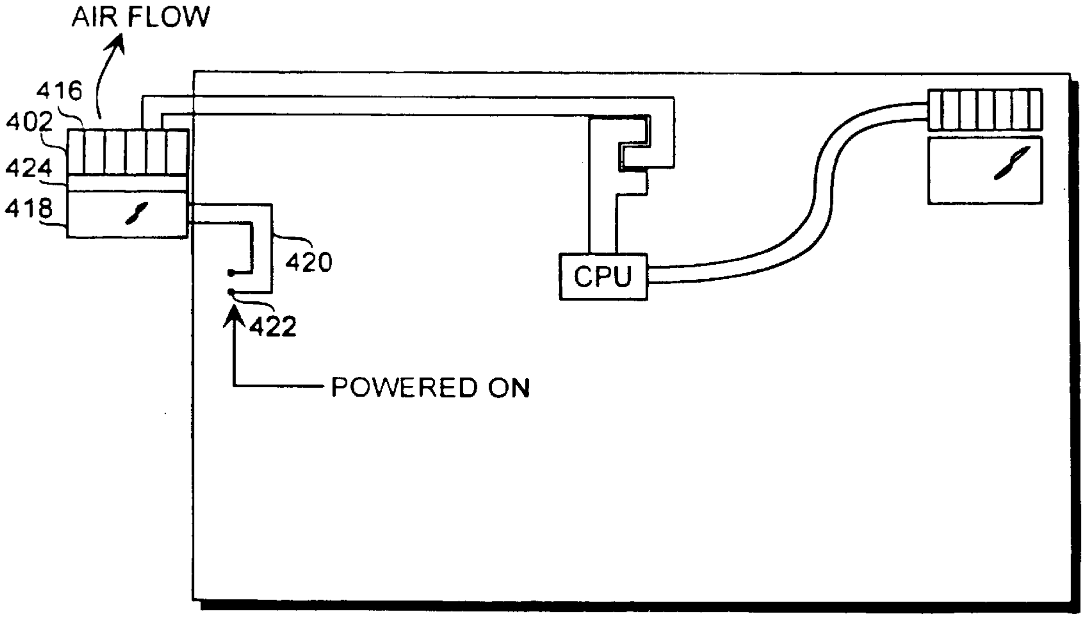

In one embodiment shown in FIGS. 4*a–b*, the heat sink 402 includes an active cooling mechanism 418 (e.g., a powered fan). The active cooling mechanism 418 can be used to further assist the fins 416 in dissipating heat, in the embodiment that includes fins 416 attached to the heat sink 402. For example, as illustrated in FIG. 4*a*, when the heat sink 402 is removed from the computer system, a powered fan may be used to blow continuous air on the fins of the heat sink. Furthermore, in an embodiment implementing a powered fan as the active cooling mechanism, a duct 424 may be attached to the fan (as illustrated in FIGS. 4*a–b*) to focus the flow of air onto the heat sink to further assist in cooling the heat sink. In alternative embodiments, other types of active cooling mechanisms may be used without departing from the scope of the invention.

As further illustrated in FIG. 4*a*, electrical contacts 420 (e.g., electrical wires) to provide voltage to the active cooling mechanism 418 are engaged with a power source contacts 422 when the heat sink is removed into the bay of the computer system, to provide power to the active cooling mechanism 418. When the heat sink is inserted into the computer system (as illustrated in FIG. 4*b*), the electrical contacts 420 disengage the power source contacts 422 to stop providing power to the active cooling mechanism 418. In alternative embodiment, other configurations may be implemented to provide power to the active cooling mechanism, without departing from the scope of the invention.

Figure 5A:
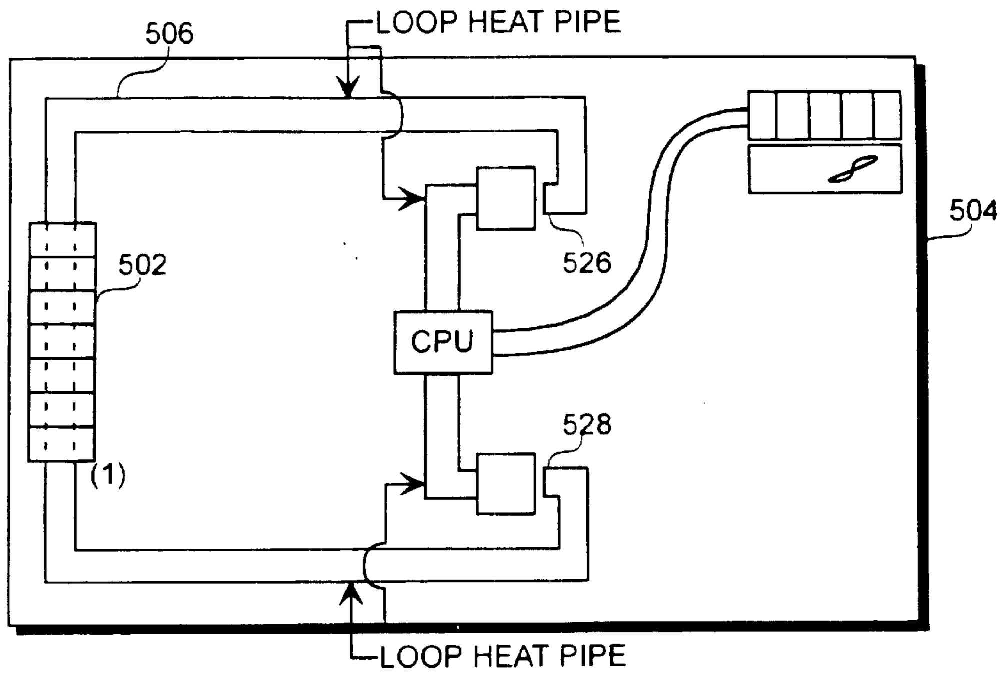
FIGS. 5*a–b* illustrate a loop heat pipe attached to the heat sink according to one embodiment.
Figure 5B:
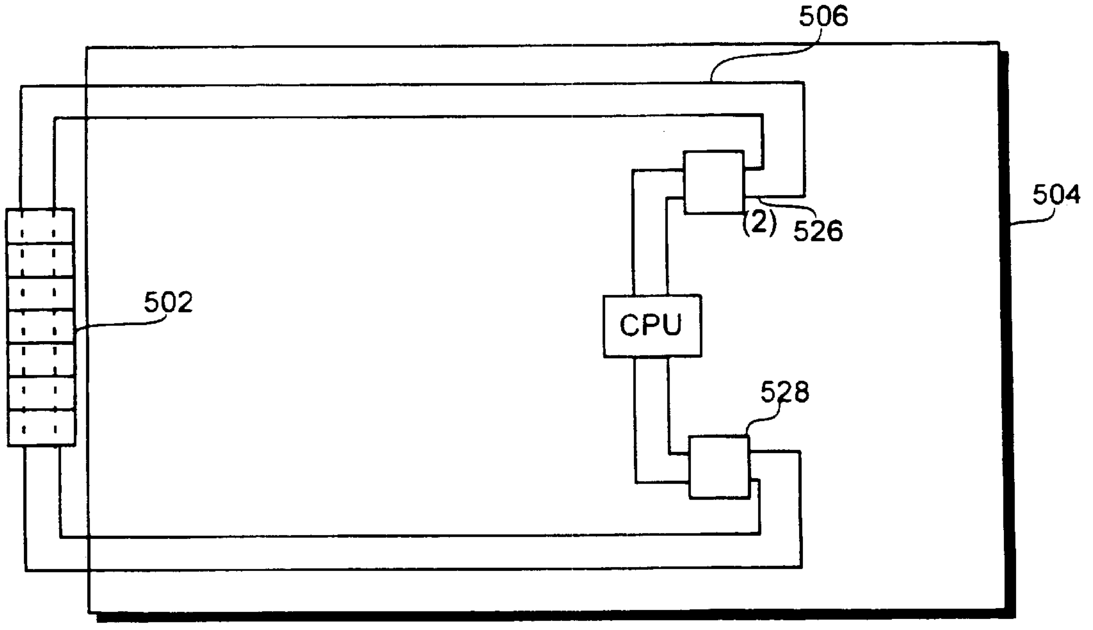

In one embodiment, as illustrated in FIGS. 5*a–b*, the heat pipe 506 attached to the heat sink 502 is a loop heat pipe routed through the computer system 504, which allows for the passage of a cooling substance to be passed throughout the heat pipe 506 to further assist in cooling of the computer system.

As illustrated in FIG. 5*a*, when the heat sink is inserted into the computer system, a first 526 and/or second end 528 of the loop heat pipe are disengaged to prevent the cooling substance from passing throughout the loop heat pipe 506. However, when the heat sink is removed from the computer system (as shown in FIG. 5*b*), the first 526 and/or second 528 ends of the loop heat pipe is re-engaged to allow the cooling substance to flow throughout the loop heat pipe and further assist in cooling the computer system.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A computer apparatus comprising:

a computer with a heat source;

a heat sink moveable from inside to outside said computer apparatus;

a heat pipe coupled to the heat sink and moveable therewith, the heat pipe engaged with the heat source when the heat sink is removed from the computer, and the heat pipe disengaged from the heat source when the heat sink in inserted into the computer; and the heat sink is deactivated when the heat sink is inserted into the computer and activated to dissipate heat when the heat sink is removed from the computer.

2. The computer apparatus of claim 1, wherein the heat sink includes a set of fins, the fins are folded when the heat sink is inserted into the computer apparatus and the fins are unfolded when the heat sink is removed from the computer apparatus.

3. The computer apparatus of claim 1, wherein the heat sink includes an active cooling mechanism.

4. The computer apparatus of claim 1, wherein the heat pipe is a loop heat pipe conveying a cooling substance throughout the heat pipe.

5. The computer apparatus of claim 3, wherein the active cooling mechanism is activated when the heat sink is removed from the computer apparatus and deactivated when the heat sink is inserted in the computer apparatus.

6. A computer system comprising:

a heat source;

a heat sink moveable from inside to outside a computer apparatus;

a heat pipe coupled to the heat sink and moveable therewith, the heat pipe engaged with the heat source when the heat sink is removed from the computer apparatus, and the heat pipe disengaged from the heat source when the heat sink is inserted into the computer apparatus; and the heat sink is deactivated when the heat sink is inserted into the computer apparatus and activated to dissipate heat when the heat sink is removed from the computer apparatus.

7. The computer system of claim 6, wherein the heat sink includes a set of fins, the fins are folded when the heat sink is inserted into the computer apparatus and the fins are unfolded when the heat sink is removed from the computer apparatus.

8. The computer system of claim 6, wherein the heat sink includes and active cooling mechanism.

9. The computer system of claim 6, wherein the heat pipe is a loop heat pipe conveying a cooling substance throughout the heat pipe.

10. The computer system of claim 8, wherein the active cooling mechanism is activated when the heat sink is removed from the computer apparatus and deactivated when the heat sink is inserted in the computer apparatus.

11. A method of removing heat from a computer comprising:

deactivating a heat sink, coupled to a heat pipe and moveable therewith, by inserting the heat sink into the computer;

activating the heat sink to dissipate heat by removing the heat sink from the computer;

placing a heat pipe, coupled to the heat sink and moveable therewith, in contact with a heat source when the heat sink is removed from the computer; and removing the heat pipe from contact with the heat source when the heat sink is inserted into the computer.

12. The method of claim 11, further comprising:

a set of fins coupled to the heat sink unfolding when the heat sink is removed from the computer; and the set of fins folding when the heat sink is inserted into the computer.

13. The method of claim 11, wherein the heat sink includes an active cooling mechanism.

14. The method of claim 11, wherein the heat pipe is loop heat pipe conveying a cooling substance throughout the heat pipe.

15. The method of claim 13, further comprising:

activating the active cooling mechanism when the heat sink is removed from the computer; and deactivating the active cooling mechanism when the heat sink is inserted in the computer.

* * * * *